(12) United States Patent
Cok et al.

(10) Patent No.: US 6,995,035 B2
(45) Date of Patent: Feb. 7, 2006

(54) METHOD OF MAKING A TOP-EMITTING OLED DEVICE HAVING IMPROVED POWER DISTRIBUTION

(75) Inventors: Ronald S. Cok, Rochester, NY (US); Steven A. Van Slyke, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 195 days.

(21) Appl. No.: 10/462,360

(22) Filed: Jun. 16, 2003

(65) Prior Publication Data

US 2004/0253756 A1 Dec. 16, 2004

(51) Int. Cl.
*H01L 21/00* (2006.01)

(52) U.S. Cl. .......................... 438/82; 438/99; 438/725; 438/940

(58) Field of Classification Search .................. 438/82, 438/99, 725, 706, 707, 708, 940
See application file for complete search history.

(56) References Cited

U.S. PATENT DOCUMENTS

| | | | |
|---|---|---|---|
| 6,433,355 B1 | 8/2002 | Riess et al. | 257/40 |
| 6,444,400 B1 | 9/2002 | Cloots et al. | 430/311 |
| 6,468,819 B1 | 10/2002 | Kim et al. | 438/22 |
| 6,763,167 B2 * | 7/2004 | Gaudiana et al. | 385/120 |
| 2001/0043046 A1 | 11/2001 | Fukunaga | 315/160 |
| 2002/0011783 A1 | 1/2002 | Hosokawa | 313/504 |
| 2002/0158835 A1 | 10/2002 | Kobayashi et al. | 354/100 |
| 2003/0092267 A1 * | 5/2003 | Klan et al. | 438/690 |
| 2003/0129784 A1 * | 7/2003 | Pakbaz et al. | 438/99 |

* cited by examiner

*Primary Examiner*—Caridad M. Everhart
(74) *Attorney, Agent, or Firm*—Raymond L. Owens

(57) ABSTRACT

A method of making a top-emitting OLED device, includes providing over a substrate laterally spaced and optically opaque lower electrodes and upper electrode busses which are electrically insulated from the lower electrodes; depositing an organic EL medium structure over the lower electrodes and the upper electrode busses; selectively removing the organic EL medium structure over at least portions of the upper electrode busses to reveal at least upper surfaces of the upper electrode busses; and depositing a light transmissive upper electrode over the organic EL medium structure so that such upper electrode is in electrical contact with at least upper surfaces of the upper electrode busses.

12 Claims, 11 Drawing Sheets

METHOD OF MAKING A TOP-EMITTING OLED DEVICE HAVING IMPROVED POWER DISTRIBUTION

FIELD OF THE INVENTION

The present invention relates to top-emitting organic light-emitting diode (OLED) devices and, more particularly, to a method of making a top-emitting OLED device having improved power distribution in a light transmissive upper electrode.

BACKGROUND OF THE INVENTION

Organic light-emitting diode (OLED) devices, also referred to as organic electroluminescent (EL) devices, have numerous well known advantages over other flat-panel display devices currently in the market place. Among these advantages are brightness of light emission, relatively wide viewing angle, and reduced electrical power consumption compared to, for example, liquid crystal displays (LCDs) using backlighting.

Applications of OLED devices include active matrix image displays, passive matrix image displays, and area lighting devices such as, for example, selective desktop lighting. Irrespective of the particular OLED device configuration tailored to these broad fields of applications, all OLEDs function on the same general principles. An organic electroluminescent (EL) medium structure is sandwiched between two electrodes. At least one of the electrodes is light transmissive. These electrodes are commonly referred to as an anode and a cathode in analogy to the terminals of a conventional diode. When an electrical potential is applied between the electrodes so that the anode is connected to the positive terminal of a voltage source and the cathode is connected to the negative terminal, the OLED is said to be forward biased. Positive charge carriers (holes) are injected from the anode into the EL medium structure, and negative charge carriers (electrons) are injected from the cathode. Such charge carrier injection causes current flow from the electrodes through the EL medium structure. Recombination of holes and electrons within a zone of the EL medium structure results in emission of light from this zone that is, appropriately, called the light-emitting zone or interface. The emitted light is directed towards an observer, or towards an object to be illuminated, through the light transmissive electrode. If the light transmissive electrode is between the substrate and the light emissive elements of the OLED device, the device is called a bottom-emitting OLED device. Conversely, if the light transmissive electrode is not between the substrate and the light emissive elements, the device is referred to as a top-emitting OLED device.

The organic EL medium structure can be formed of a stack of sublayers that can include small molecule layers and polymer layers. Such organic layers and sublayers are well known and understood by those skilled in the OLED art.

Because light is emitted through an electrode, it is important that the electrode through which light is emitted be sufficiently light transmissive to avoid absorbing the emitted light. Typical prior art materials used for such electrodes include indium tin oxide and very thin layers of metal. However, the current carrying capacity of electrodes formed from these materials is limited, thereby limiting the amount of light that can be emitted from the organic layers.

The present invention is directed to a method of making a top-emitting OLED device.

In top-emitting OLED devices, light is emitted through an upper electrode or top electrode which has to be sufficiently light transmissive, while the lower electrode(s) or bottom electrode(s) can be made of relatively thick and electrically conductive metal compositions which can be optically opaque.

In conventional integrated circuits, bus connections are provided over the substrate to provide power to circuitry in the integrated circuit. These busses are located directly on the substrate or on layers deposited on the substrate, for example on planarization layers. In complex circuits, multiple levels of bus lines are located over the substrate and separated by insulating layers of material. For example, OLED displays sold by the Eastman Kodak Company utilize multiple bus lines located on the substrate and on various planarization layers. However, these busses are not useful to provide power to the light transmissive upper electrode in an OLED device because conventional photolithography techniques destroy the organic layers and thin upper electrode necessary for a top-emitting OLED device.

U.S. Patent Application Publication 2002/0011783 A1 proposes to solve this problem by the formation of auxiliary electrodes in contact with the upper or top electrode. The auxiliary electrode may be either above or below the upper electrode. The auxiliary electrode has greater thickness and conductivity thereby increasing the current carrying capacity of the upper electrode. However, this approach has difficulties in that it reduces the light emitting area of the OLED device and is difficult to manufacture. In particular, if the auxiliary electrode is formed before the organic elements are deposited, forming a good electrical contact between the upper and auxiliary electrodes is difficult, because the organic materials will be deposited on the auxiliary electrode. Moreover, undesirable moisture can infiltrate through materials at the corners of the auxiliary electrode and the conformal deposition of an additional upper electrode protection and encapsulation layer is problematic. If the auxiliary electrode is deposited above the upper electrode, a patterned deposition process is relatively difficult and liable to destroy both the upper electrode and the organic layers beneath it.

A second prior art method to address this problem is to use an auxiliary electrode, as proposed by U.S. Patent Application Publication 2001/0043046 A1 by Fukunaga et al. entitled "Luminescent Apparatus and Method of Manufacturing the Same." However, this approach requires a complex multistep processing method and suffers from the above described difficulties.

U.S. Patent Application Publication 2002/0158835 A1 by Kobayashi et al. entitled "Display Device and Method of Manufacturing the Same", discloses the use of auxiliary wiring elements which are electrically connected to a light transmissive second or upper electrode of an active matrix type planar display device. The auxiliary wiring elements are formed in the same layer or on the same surface as first or lower electrodes, and the auxiliary wiring elements are electrically insulated from the first electrodes. However, Kobayashi et al. provide no drawings describing process steps used in a method of making the device. Moreover, the electrical connection disclosed by Kobayashi et al. is formed between partition walls. The construction of suitable partition walls adds complexity to the process, reduces yields, adds cost, and limits the resolution of the interconnections.

The use of lasers and other techniques to form patterns in integrated circuits is known. For example, U.S. Pat. No. 6,468,819, entitled "Method for Patterning Organic Thin Film Devices Using a Die", describes the use of a die to form patterns and references the use of laser ablation to form patterns. U.S. Pat. No. 6,444,400, entitled "Method of Making an Electroconductive Pattern on a Support", likewise describes ablation, including the use of infrared lasers. Other patents, for example U.S. Pat. No. 6,433,355 issued Aug. 13, 2002, entitled "Non-Degenerate Wide Bandgap Semiconductors as Injection Layers and/or Contact Electrodes for Organic Electroluminescent Devices", also describe the use of laser ablation for patterning. However, none of these methods address problems with power distribution in a top-emitting OLED device.

SUMMARY OF THE INVENTION

It is therefore an object of the present invention to provide a method of making a top-emitting OLED device having improved power distribution.

It is another object of the present invention to provide a method of making different classes of top-emitting OLED devices having improved power distribution.

These objects are achieved by a method of making a top-emitting OLED device, comprising:

a) providing over a substrate laterally spaced and optically opaque lower electrodes and upper electrode busses which are electrically insulated from the lower electrodes;

b) depositing an organic EL medium structure over the lower electrodes and the upper electrode busses;

c) selectively removing the organic EL medium structure over at least portions of the upper electrode busses to reveal at least upper surfaces of the upper electrode busses; and d) depositing a light transmissive upper electrode over the organic EL medium structure so that such upper electrode is in electrical contact with at least upper surfaces of the upper electrode busses.

BRIEF DESCRIPTION OF THE DRAWINGS

FIGS. 2A–2E show schematic sectional views of major process steps for making the OLED device of FIG. 1, in accordance with aspects of the present invention, in which FIG. 2A depicts providing laterally spaced lower electrodes and forming upper electrode busses;

FIG. 2B shows electrical insulation formed between the lower electrodes and the upper electrode busses so that upper surfaces of the busses are revealed;

FIG. 2C shows schematically in dotted outline an organic EL medium structure deposited over the lower electrodes, the insulation, and the upper electrode busses;

FIG. 2D depicts schematically a step of selectively removing the organic EL medium structure from the upper electrode busses and from portions of the insulation; and FIG. 2E depicts the device of FIG. 1 upon forming a light transmissive upper electrode over the EL medium structure and in electrical contact with each of the upper electrode busses;

FIGS. 3A–3C are schematic sectional views of major process steps for making a modified OLED device in which the electrical insulation is optically opaque, wherein FIG. 3A depicts the opaque electrical insulation extending initially over the upper electrode busses, and the organic EL medium structure deposited over the lower electrodes and over the electrical insulation;

FIG. 3B shows schematically a step of selectively removing the organic EL medium structure and portions of the optically opaque electrical insulation so that surfaces of the upper electrode busses are revealed; and FIG. 3C depicts a modified top-emitting passive matrix OLED device upon forming a light transmissive upper electrode over the organic EL medium structure and in electrical contact with each of the upper electrode busses;

FIG. 7B shows a bus trench formed in the first organic planarizing layer for revealing the connector to an upper electrode bus, and showing lower electrode connectors containing a second organic planarizing layer;

FIG. 7C depicts the process upon deposition of lower electrodes and upper electrode buss(es);

FIG. 7D shows an organic electroluminescent (EL) medium structure formed over the lower electrodes, the upper electrode bus, and over portions of the first organic planarizing layer;

FIG. 7E indicates schematically a step of selectively removing the EL medium structure over the upper electrode bus; and FIG. 7F depicts the device of FIG. 6 upon forming a light transmissive upper electrode over the EL medium structure and in electrical contact with each of the upper electrode busses;

The drawings are necessarily of a schematic nature since layer thickness dimensions are frequently in the sub-micrometer ranges, while features representing lateral device dimensions can be in a range from 10 micrometer to several 100 micrometer. Accordingly, the drawings are scaled for ease of visualization rather than for dimensional accuracy.

DETAILED DESCRIPTION OF THE INVENTION

As used herein, the term "light transmissive" refers to an upper electrode or top electrode of an OLED device, and denotes an optical transmission of between 50% and 95% of light directed perpendicularly at a surface of such electrode. The term "optically opaque" refers to lower electrodes or bottom electrodes, upper electrode busses, bus connectors, and bus connector pads, and denotes an optical transmission of less than 0.5% of light directed perpendicularly at a surface of such electrically conductive elements.

The terms "pixel" and "subpixel" are generally used to designate the smallest addressable element of a display. For monochrome OLED displays there is no distinction between a pixel and a subpixel. In multicolor displays, or in full-color displays, a subpixel designates any portion of a pixel, which can be independently addressed to emit light of a specific color.

Figure 1:
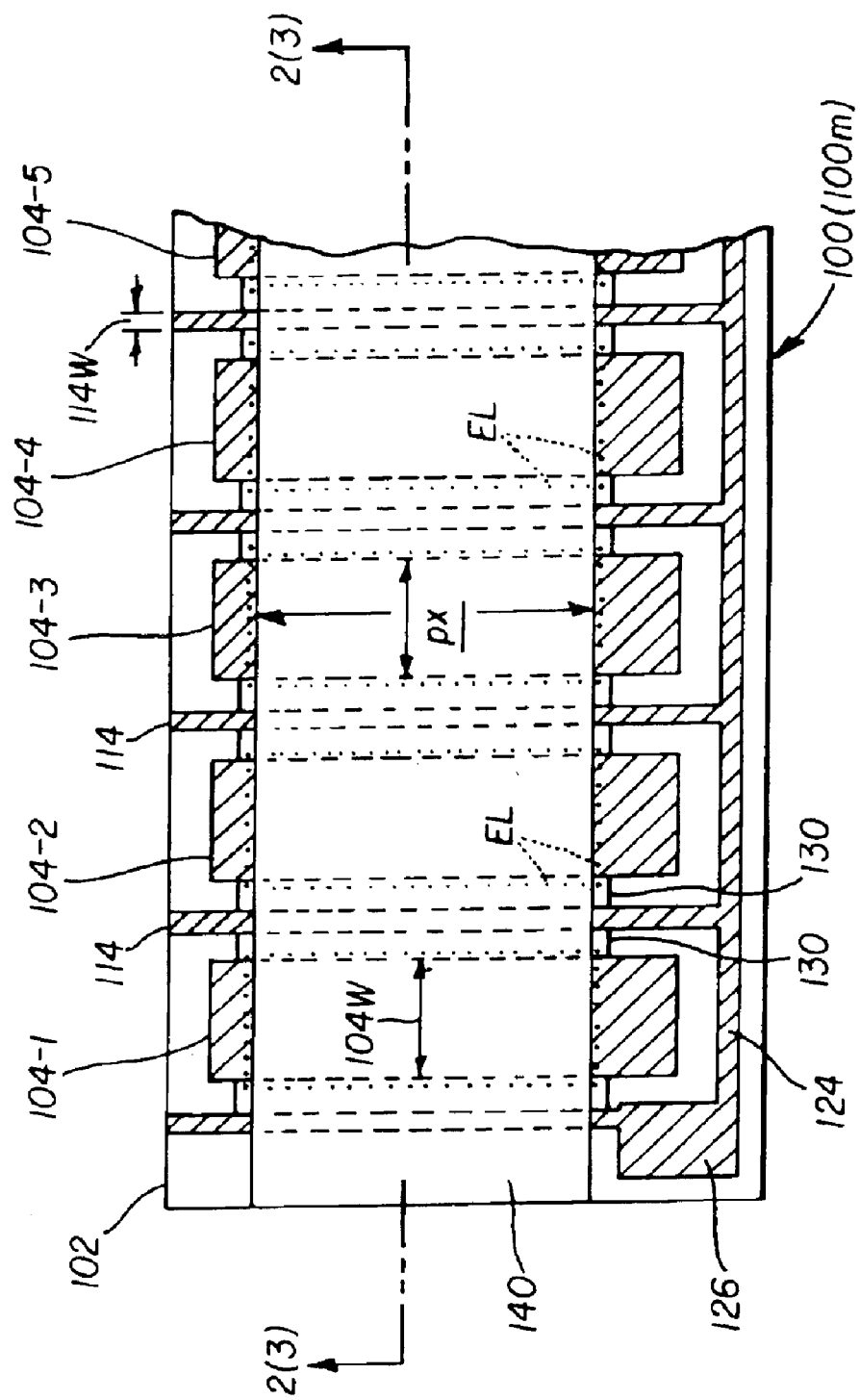
FIG. 1 is a schematic plan view of a top-emitting passive matrix OLED device having laterally spaced lower electrodes, and upper electrode busses in electrical contact with a light transmissive upper electrode.

Turning to FIG. 1, a schematic plan view of a top-emitting passive matrix OLED device 100 is shown which incorporates aspects of the present invention.

FIGS. 2A–2E are schematic sectional views, taken along the section lines 2—2 in FIG. 1, and indicating a sequence of major process steps for making the OLED device 100.

Figure 2A:
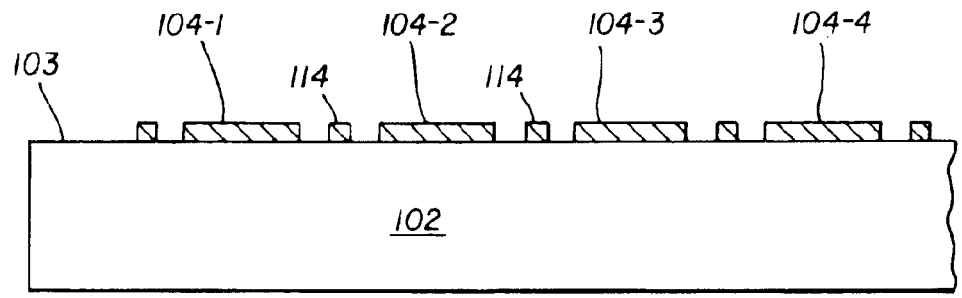

Viewing FIG. 1 and FIGS. 2A–2E together, a plurality of laterally spaced lower electrodes 104-1, 104-2, 104-3, 104-4, 104-5 are formed on a substrate surface 103 of an electrically insulative substrate 102. Upper electrode busses 114, a bus connector 124, and a bus connector pad 126 can be formed at the same time on the substrate surface 103. Since the upper electrode busses 114 are single-level busses disposed in one and the same plane as the spaced lower electrodes, the busses 114 and the lower electrodes can be formed concurrently. The upper electrode busses 114 are formed so as to be laterally spaced from the lower electrodes 104-1 through 104-5. The result of this process step is depicted in FIG. 2A. The lower electrodes 104 can have a width dimension 104W in a range of 50–250 micrometer, and the upper electrode busses 114 can have a width dimension 114W in a range of 3–10 micrometer.

Useful electrically insulative substrates 102 include glass substrates, quartz substrates, plastic substrates, ceramic substrates, and substrates having an electrically insulative surface layer provided over an otherwise electrically conductive substrate body.

The lower electrodes 104-1 through 104-5, and the upper electrode busses 114, as well as the bus connector 124 and pad 126, are made of a metal, a metal alloy, or of a multilayer metal sandwich, and are formed at a thickness (not indicated in the drawings) selected to provide sufficiently high electrical conductivity, long-term physical and chemical stability, and adhesion to the substrate surface 103. Additionally, the selection of a metal has to be viewed in terms of a propensity to inject positive charge carriers (holes) into an organic electroluminescent organic electroluminescent (EL) medium structure. A metal having a work function $\geqq 4.0$ eV is considered to have acceptable hole-injecting propensity. Hole-injecting propensity can be improved by providing a hole-injecting layer (not shown) over the lower electrodes. Particularly useful materials for forming a hole-injecting layer include conductive metal oxides such as, for example, indium-tin oxide (ITO), phthalocyanine compounds such as, for example, copper phthalocyanine, and plasma-deposited fluorocarbon materials (CFx).

In view of the above considerations, particularly useful metals include silver, gold, platinum, iridium, tantalum, tungsten, molybdenum, nickel, and aluminum, or selected alloys, or sandwich structures of such metals.

Various known methods can be chosen to provide the pattern of the lower electrodes, the upper electrode busses, the bus connector, and the bus connector pad. Among such known methods are printing, vapor deposition through a pattern mask, vapor deposition of a pattern defined by a photoresist pattern in a so-called "lift-off" process, and patterning a uniformly deposited layer by selective etching via a photoresist etch mask.

The thickness of the patterned metal features renders them optically opaque. Upper surfaces can be optically reflective, with a level of reflectivity determined by choice of metal or metals and by micro-topological aspects of the upper surface.

Figure 2B:
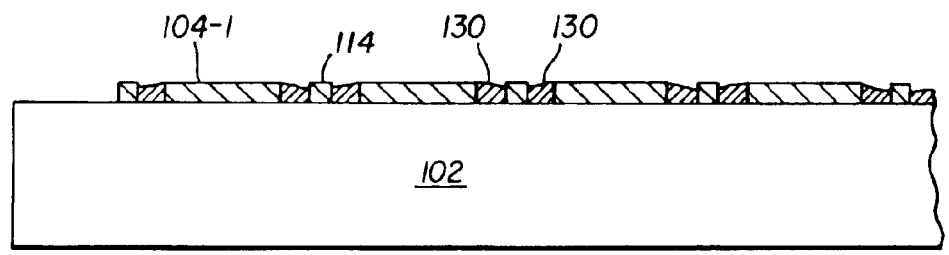
Figure 2C:
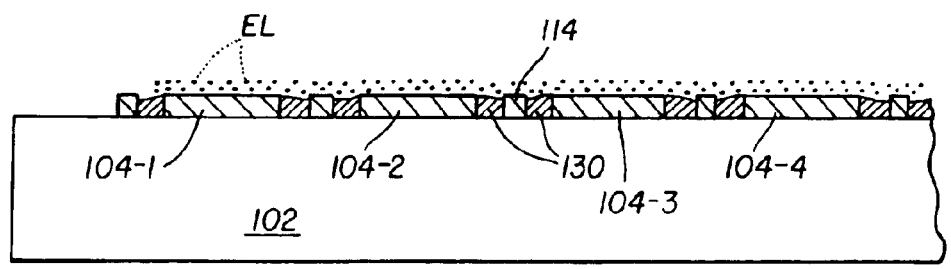

As indicated in FIG. 2B, electrical insulation 130 is formed between the lower electrodes 104 and the upper electrode busses 114 so that upper surfaces (not identified) of the busses are revealed. The electrical insulation can be an organic photoresist material, which has been patterned by a photolithographic process.

An organic EL medium structure ("EL"), shown in dotted outline in FIGS. 1 and 2C–2E, is deposited over the lower electrodes 104, the electrical insulation 130, and the upper electrode busses 114. The organic EL medium structure can be a multilayer structure which includes, in sequence, a hole-injecting layer, a hole-transporting layer, a light-emitting layer, an electron-transporting layer, and an electron-injecting layer. Such multilayer structures are well known in the art of designing and making OLED devices. The EL medium structure can include small molecule layers and polymer layers.

If the top-emitting passive matrix OLED device 100 is designated to be a monochrome light-emitting device, one and the same organic EL medium structure is formed over all lower electrodes, electrical insulation, and upper electrode busses.

If the top-emitting passive matrix OLED device 100 is designated to be a multicolor device or a full-color device, the light-emitting layer of the multilayer structure is deposited selectively over selected lower electrodes. For example, a red light-emitting layer is formed over lower electrodes 104-1 and 104-4, and extends laterally over adjacent electrical insulation 130. A green light-emitting layer is formed over lower electrode 104-2, and a blue light-emitting layer is formed over lower electrode 104-3. These light-emitting layers overlap or abut over the insulation 130 or over the upper electrode busses 114. All other organic layers of the multilayer organic EL medium structure are commonly deposited over all lower electrodes, upper electrode busses, and electrical insulation.

Figure 2D:
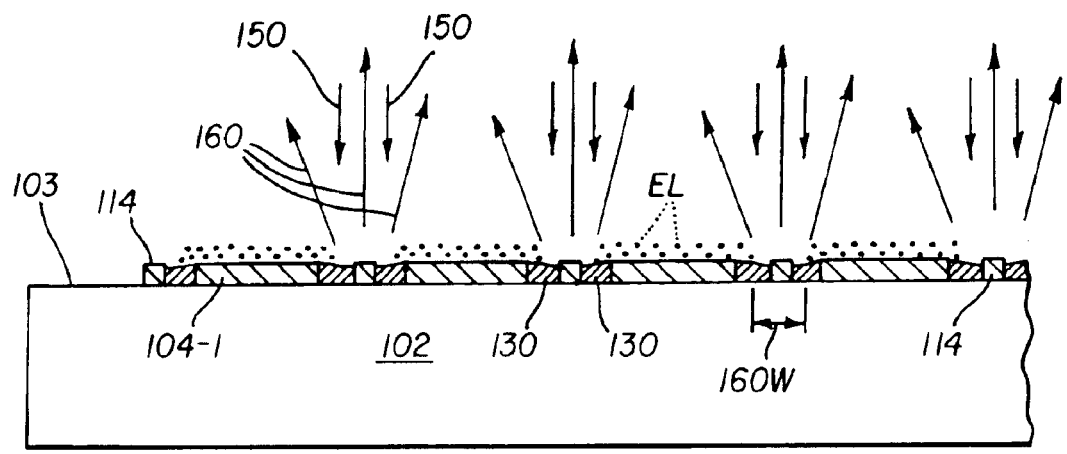

FIG. 2D depicts a step of selectively removing the organic EL medium structure from the upper electrode busses 114 and from portions of the electrical insulation 130, resulting in a width dimension 160W over the electrical insulation 130 upon removal of the EL medium. Selective removal of the organic EL medium structure occurs by selectively ablating the structure via radiation 150, which is selectively directed at zones or areas from which the EL medium structure is to be removed. Ablated material is indicated by arrows 160, which represent the directions of selective removal of the EL medium. Preferably, this ablative process is carried out in a chamber (not shown) held at reduced pressure. It will be appreciated that the process of ablation includes resublimation of organic materials, which were originally deposited by a sublimation process.

Selectively ablating portions of the organic EL medium structure can be accomplished by providing the radiation 150 in the form of a linear array of laser light beams directed towards the upper electrode busses, and by providing relative motion between the laser light beams and the substrate 102.

Selectively ablating portions of the organic EL medium structure can also be achieved by providing a source of uniform radiation directed towards the organic EL medium structure, and by providing a mask between the source and the structure, with the mask having openings which are oriented with respect to the upper electrode busses 114. Thus, the radiation 150 is defined by openings in a mask.

Alternatively, selectively ablating portions of the organic EL medium structure can be achieved by directing one or more laser light beams 150 towards the structure in registration with the upper electrode busses 114.

The use of laser beams and of other techniques of forming patterns in integrated circuits is well known. For example, U.S. Pat. No. 6,468,819 describes the use of a die to form patterns, and references the use of laser ablation to form patterns. U.S. Pat. No. 6,444,400 discloses ablation, including the use of infrared lasers. U.S. Pat. No. 6,433,355 describes laser ablation for patterning semiconductor injection layers and/or contact electrodes for OLED devices. However, these publications do not disclose or suggest selectively removing an organic EL medium structure during the fabrication of an OLED device to create a via for connecting a transparent electrode to an opaque bus line.

Figure 2E:
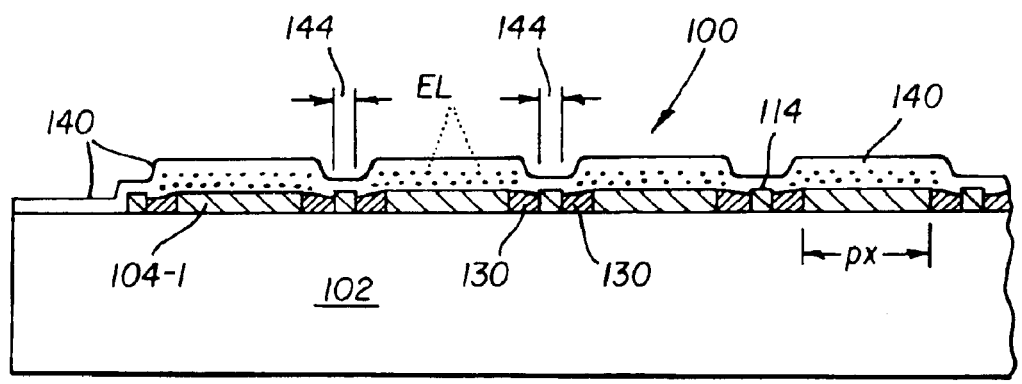

FIG. 2E depicts the completed top-emitting passive matrix OLED device 100 of FIG. 1 upon forming a common light transmissive upper electrode 140 over the organic EL medium structure. The common upper electrode is in electrical contact with each of the upper electrode busses 114 at an electrical contact region 144. A light-emitting portion px of a pixel or of a subpixel is defined here as the overlap area between a lower electrode 104 and the light transmissive upper electrode 140.

The light transmissive upper electrode 140 can be formed of a thin metal film or of a layer of relatively transparent and electrically conductive metal oxides, or a combination of these materials. An electron-injecting interfacial layer, for example a lithium fluoride (LiF) interfacial layer, may be formed as an uppermost layer of the EL medium structure, followed by a layer of aluminum (Al). In combination, layers of these materials comprise the light transmissive upper electrode 140, as described, for example in U.S. Pat. No. 5,677,572. Other useful upper electrode material sets include, but are not limited to, those disclosed in U.S. Pat. Nos. 5,059,861 and 5,059,862. The term transparent as used in this specification includes materials which pass sufficient light to permit the OLED device to operate effectively as a top-emitter. For example, alternative thin films of transparent electrode material useful for the present invention include indium tin oxide (ITO) in combination with an electron-injecting layer or alloys of a low-work function material with other metals or alloys, for example, Li/Ag, LiF/Al/Ag, and alloys of magnesium with other metals (such as MgAg, MgAl, MgSn, MgIn, or MgZn, with or without an additional layer of Ag or any other highly conductive metals or alloys).

Optically transparent cathodes (upper electrodes) have been described in more detail in U.S. Pat. Nos. 4,885,211; 5,247,190; JP 3,234,963; U.S. Pat. Nos. 5,703,436; 5,608,287; 5,837,391, 5,677,572; 5,776,622; 5,776,623; 5,714,838; 5,969,474; 5,739,545; 5,981,306; 6,137,223; 6,140,763, 6,172,459; EP 1 076 368; and U.S. Pat. Nos. 6,278,236 and 6,284,393. An upper electrode 140 is typically deposited by evaporation, sputtering, or chemical vapor deposition. When needed, patterning can be achieved through many well known methods including, but not limited to, through-mask deposition, integral shadow masking, for example, as described in U.S. Pat. Nos. 5,276,380 and 6,221,563, and EP 0 732 868, by laser ablation, and by selective chemical vapor deposition.

The electrical contact between the light transmissive common upper electrode 140 and each one of the metallic upper electrode busses 114 provides for improved power distribution within the upper electrode, thereby permitting the use of substantially light transmissive materials in forming the upper electrode. Stated differently, undesirable voltage drops along or across a light transmissive upper electrode can be substantially reduced or avoided by providing multiple electrical connections between such electrode and metallic, electrically conductive upper electrode busses 114.

Figure 3A:
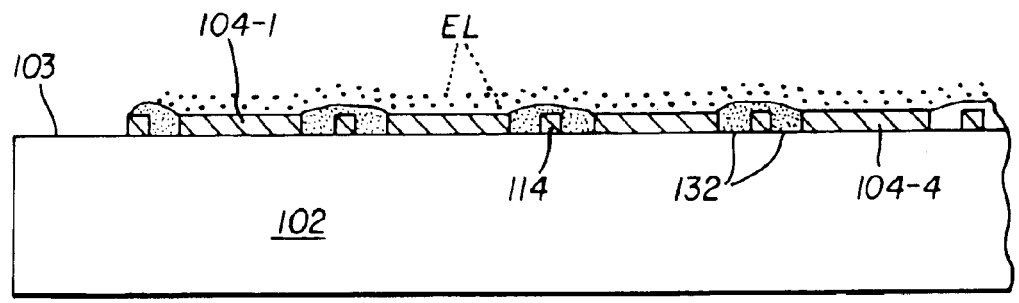
Figure 3B:
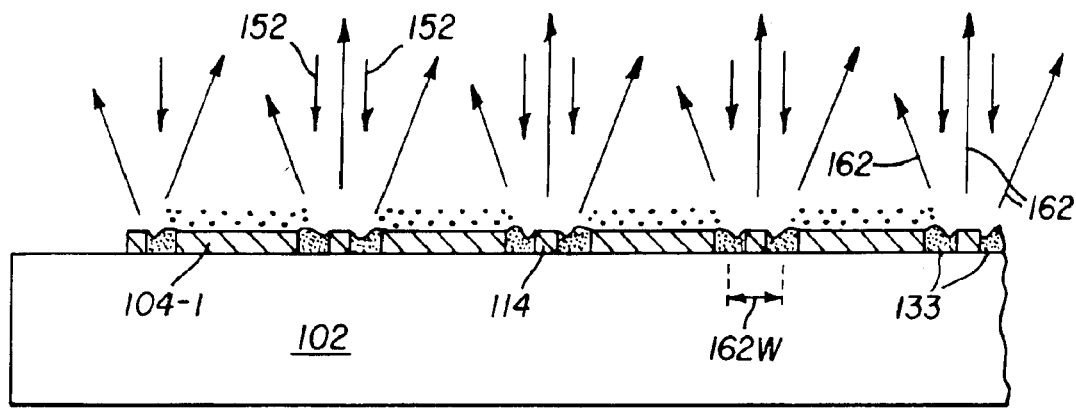
Figure 3C:
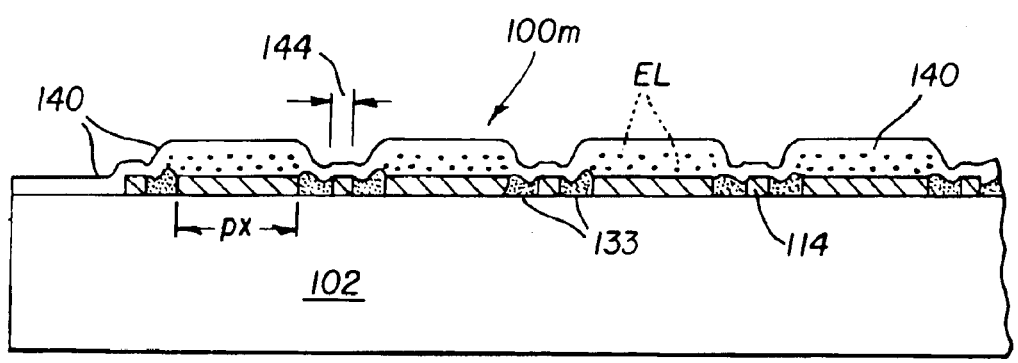

FIGS. 3A–3C are schematic sectional views of an abbreviated sequence of process steps for making a modified top-emitting passive matrix OLED device 100*m*, which differs from the device of FIG. 1 and FIGS. 2A–2E in that optically opaque electrical insulation 132 replaces the electrical insulation 130. Also, as shown in FIG. 3A, the insulation 132 extends initially over each of the upper electrode busses 114. The organic EL medium structure ("EL") has been formed over the lower electrodes 104 and over an upper surface (not identified) of the electrical insulation 132.

In FIG. 3B, radiation 152 is directed towards the EL medium structure in registration with the upper electrode busses 114 so as to selectively remove by ablation the EL medium structure and central portions of the optically opaque electrical insulation. The directions of selective removal of the EL medium and of the portions of the insulation are indicated by arrows at 162. The organic EL medium structure has been removed over a width dimension 162W, and surfaces of the upper electrode busses 114 are revealed between remaining optically opaque electrical insulation 133.

FIG. 3C depicts the modified OLED device 100*m* upon forming a light transmissive upper electrode 140 over the organic EL medium structure. The common upper electrode 140 is in electrical contact with each of the upper electrode busses 114 at an electrical contact region 144.

Selection of materials and process techniques in making the modified device 100*m* are the same as described with reference to FIGS. 2A–2E. An intensity level of radiation 152 may be different from an intensity level of radiation 150 to meet the requirement of selectively removing a portion of the optically opaque electrical insulation 132, and to provide remaining insulation 133.

Figure 4:
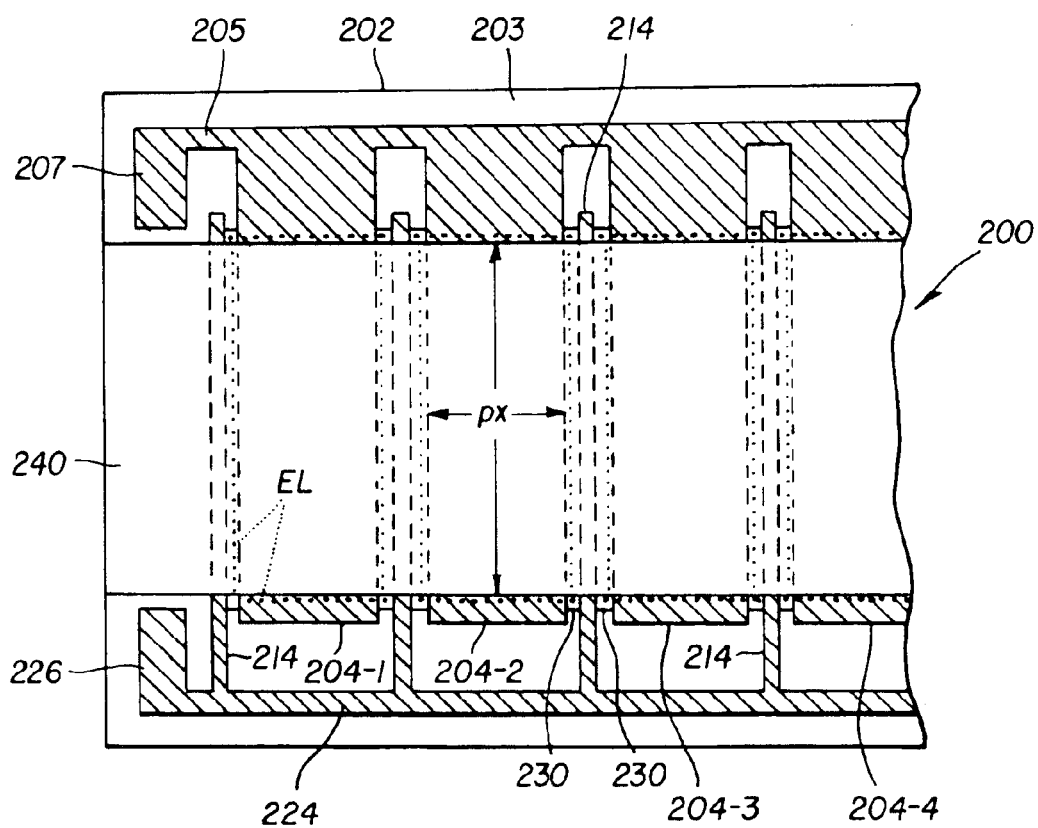
FIG. 4 is a schematic plan view of a top-emitting OLED illuminator device having laterally spaced lower electrodes electrically connected in parallel, and upper electrode busses in electrical contact with a light transmissive upper electrode.

Turning to FIG. 4, there is shown a schematic plan view of a top-emitting OLED illuminator device 200 made in accordance with aspects of the present invention.

The OLED illuminator device 200 can be fabricated using the same sequence of process steps as described above with reference to FIGS. 2A–2E, or alternatively, as described with reference to FIGS. 3A–3C. The device 200 differs from the passive matrix OLED device 100 of FIG. 1 in that all lower electrodes, depicted as lower electrodes 204-1, 204-2, 204-3, and 204-4, etc., are electrically connected in parallel by a common lower electrode connector 205 which leads to a common lower electrode terminal 207.

As indicated by identical shading in FIG. 4, the lower electrodes 204, the connector 205 and terminal 207, the upper electrode busses 214, the common bus connector 224, and the bus connector terminal 226 can be formed concurrently by using conventional photolithographic patterning processes.

The OLED illuminator device 200 is formed over a substrate surface 203 of a substrate 202. Electrical insulation 230, and common light transmissive upper electrode 240 correspond to electrical insulation 130, and to upper electrode 140, respectively, of the passive matrix OLED device 100 described above.

In order to provide an effective and efficient top-emitting OLED illuminator device 200, one or more luminescent dopants are incorporated in a light-emitting layer or in a light-emitting zone of the EL medium structure, the dopant (s) selected to provide emission of white light from the device 200. The EL medium structure is shown in dotted outline in FIG. 4. A light-emitting portion px is defined here as the overlap area between a lower electrode 204 and the light transmissive upper electrode 240. It will be appreciated that light emission is provided concurrently by the EL medium structure formed over all lower electrodes since all lower electrodes are electrically connected in parallel.

The OLED illuminator device 200 can have relatively large dimensions, which are only limited by the dimensions of the substrate 202.

Considerations pertaining to selecting substrates, materials for lower electrodes and upper electrode busses, upper electrode, and methods of selectively removing organic EL medium are the same as described above with reference to FIG. 1 and FIGS. 2A–2E.

Figure 5:
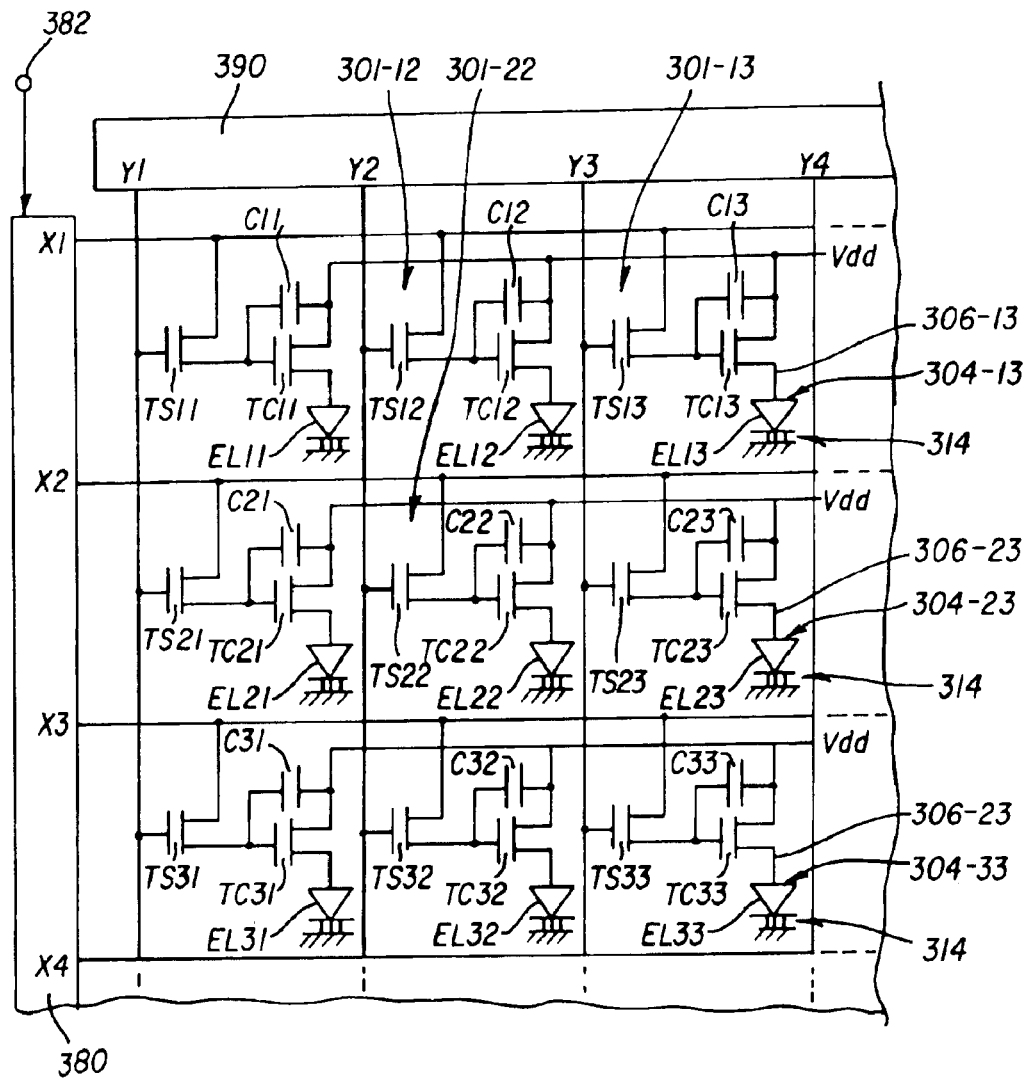
FIG. 5 depicts a partial view of an example of a circuit diagram having a two-dimensional array of repeating units, and identifying some upper electrode busses shown as triple connections, lower electrodes, lower electrode contacts, and organic EL medium structures which are shown in the form of diodes.

Turning now to FIG. 5, a non-limiting example is depicted of a partial view of a circuit diagram having a two-dimensional array of repeating units. This array is referred to as an active matrix array, and is useful for independently addressing and for driving pixels or subpixels of an OLED device. In this circuit diagram, all of the following elements are included in each repeating unit, or are associated with each unit:

X-direction data lines X1, X2, X3, . . . , Xn, Y-direction scan lines Y1, Y2, Y3, . . . , Ym, common power supply lines Vdd, thin film transistors (TFTs) for switching TS11, TS21, TS31, . . . , TS12, TS22, TS23, . . . , TS31, TS32, TS33, . . . , TSnm, thin film transistors (TFTs) for current control TC11, TC21, TC31, . . . , TC12, TC22, TC23, TC31, TC32, TC33, . . . , TCnm, capacitors C11, C21, C31, . . . , C12, C22, C23, . . . , C31, C32, C33, . . . , Cnm, X-direction data driving circuit 380, and Y-direction scan driving circuit 390. The X-direction data driving circuit 380 receives data via a data input terminal 382. The data can be digital data, video signal data, or other forms of alphanumeric data.

Some of the repeating units are identified in FIG. 5 as 301-12 (including transistors, capacitor, and electrical wiring associated with a pixel 1;2), 301-22 (associated with a pixel 2;2), and 301-13 (associated with a pixel 1;3). Respectively, corresponding organic EL medium structures are EL12, EL22, and EL13. In the circuit diagram, the EL medium structures are depicted as diodes which emit light when forward biased by an electrical signal from a TFT for current control with respect to an electrical potential which is commonly applied to the cathodes of all diodes. As depicted in FIG. 5, all cathodes are commonly connected to an electrical ground potential. For purposes of the present invention, these common connections are shown by three parallel lines, which constitute upper electrode busses 314 being in electrical contact with a common cathode (upper electrode of the present invention).

Also identified in FIG. 5 are some anodes (lower electrodes of the present invention) of the diodes, namely 304-13 (lower electrode associated with a pixel 1;3), 304-23 (lower electrode associated with a pixel 2;3), and 304-33 (lower electrode associated with a pixel 3;3). Respectively corresponding connector contact pads 306-13, 306-23, and 306-33 constitute the electrical connections to associated anodes (lower electrodes of the present invention).

When operative, the two-dimensional array of repeating units of the circuit diagram of FIG. 5 are actuated as follows:

The Y-direction scan driving circuit 390 sequentially provides a scan signal to each of the Y-direction scan lines Y1, Y2, Y3, . . . , Ym at a voltage level sufficient to cause all TFTs for switching (TSs) along a scan line to be actuated into an "on" state. At the same time, data are provided at the X-direction data lines X1, X2, X3, . . . , Xn at data signal levels corresponding to data or image information to be displayed at the location of pixels or subpixels along an "actuated" scan line. In turn, respective capacitors are charged in correspondence with the data signal levels, and respective TFTs for current control (TCs) are held in an "on" state at a level which corresponds to a charge level or voltage level of the capacitor associated with an addressed pixel or subpixel. Thus, an electric current supplied from a power supply line Vdd flows through the EL medium structure of this pixel or subpixel at a current level corresponding to the charge level or voltage level of the associated capacitor, resulting in light emission of a light intensity approximately proportional to the data signal level provided at the corresponding X-direction data line. This process is repeated for each successive Y-direction scan line.

Figure 6:
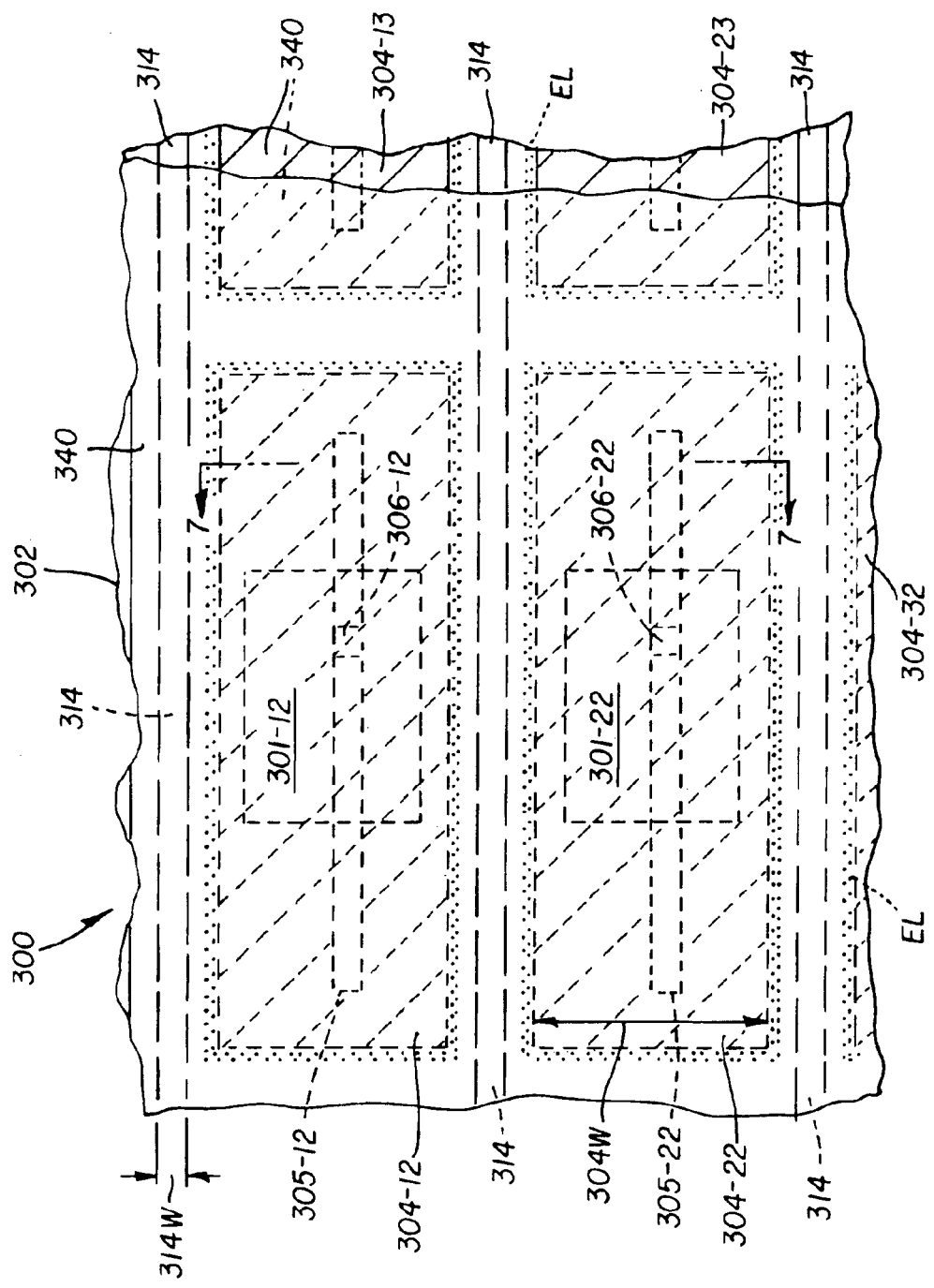
FIG. 6 is a schematic plan view of a portion of a top-emitting active matrix OLED display device in which individually addressable and optically opaque lower electrodes are connected to corresponding repeating units of the diagram of FIG. 5 and having a common light transmissive upper electrode in electrical contact with upper electrode busses.

Turning to FIG. 6, a schematic plan view of a portion of a top-emitting active matrix OLED display device 300 is shown. A common light transmissive upper electrode 340 is indicated in solid outline, and features disposed below the upper electrode 340 are shown in dashed outline.

FIGS. 7A–7F are schematic sectional views, taken along the section lines 7—7 of FIG. 6, and showing a non-limiting sequence of major process steps for making the top-emitting active matrix OLED display device of FIG. 6, in accordance with aspects of the present invention. Various alternative methods of patterning features, and alternative sequences of deposition, are known to those skilled in the art of photo-lithographic patterning and metal deposition. Such alternative methods and sequences can be used in the practice of the invention.

In order to preserve visual clarity of FIG. 6 and FIGS. 7A—7F, electrical wiring has been omitted from these drawings. The design and fabrication of bus lines and bus connections in conventional integrated circuits is well known. In complex circuits, multiple levels of bus lines are disposed over a substrate surface and over electrically insulative layers formed over the substrate. Electrical connections between bus lines formed at multiple levels occurs through openings or vias created at particular locations in the insulative layer or layers.

Viewing FIG. 6 and FIGS. 7A–7F together, and with reference to FIG. 5, over a substrate surface 303 of a substrate 302 is formed a silicon nitride layer 308, followed by a silicon dioxide layer 309. These electrically insulative layers can serve as planes or levels at which electrical wiring or bus lines can be disposed, in addition to the plane presented by the substrate surface 303.

Repeating units 301-12 and 301-22 (see FIG. 5) of transistors, capacitor, and electrical wiring correspond to pixels or subpixels 1;2 and 1;3, respectively, in the two-dimensional matrix. Connector contact pads 306-12 and 306-22 are provided to establish an electrical connection between respective thin film transistors for current control TC12, TC22, and connectors 305-12, 305-22, respectively. These connectors are shown in FIG. 6 with an elongated shape for illustrative purpose only. The connector 305-12 provides an electrical connection to a lower electrode 304-12, and connector 305-22 provides an electrical connection to a lower electrode 304-22. Since the connector contact pads, the connectors, and the lower electrodes are electrically conductive, metallic elements, the connectors 305-12, 305-22 can be sized to provide sufficient electrical contact to respective connector contact pads 306-12, 306-22. Partial views of lower electrodes 304-13, 304-23, and 304-32 are also indicated in FIG. 6.

Upper electrode busses 314 are depicted as extending laterally along or across an entire OLED device and are shown disposed in spaces between laterally spaced lower electrodes. Alternatively, a plurality of laterally spaced bus vias can replace the continuous upper electrode busses 314. Each one of the upper electrode busses 314 is in electrical contact with the common light transmissive upper electrode 340 to provide improved uniformity of current distribution or of power distribution in this common upper electrode.

Figure 7A:
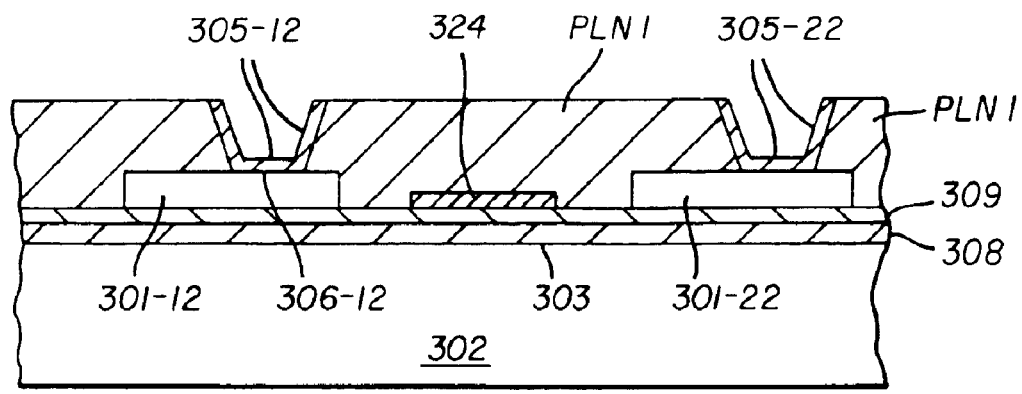
FIGS. 7A–7F show schematic sectional views of major process steps for making the top-emitting active matrix OLED display device of FIG. 6, in accordance with aspects of the present invention, in which FIG. 7A indicates lower electrode connectors connected to corresponding repeating circuit elements, a connector to an upper electrode bus, and a first organic planarizing layer in which the lower electrode connectors are formed.
Figure 7B:
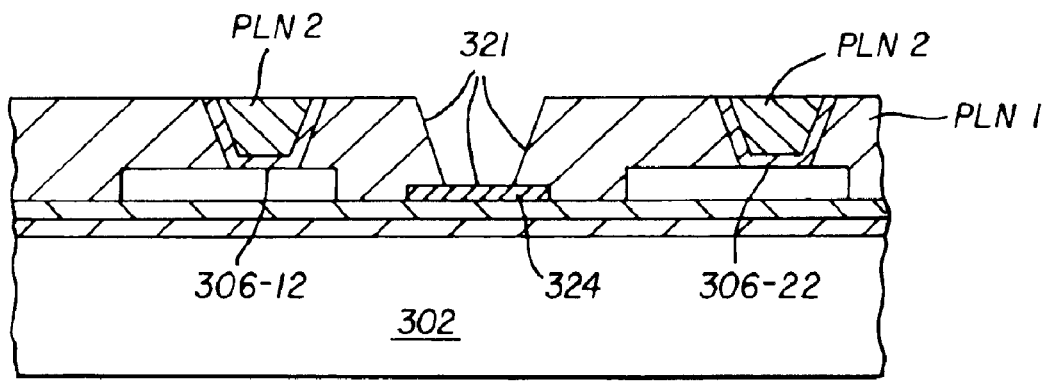
Figure 7C:
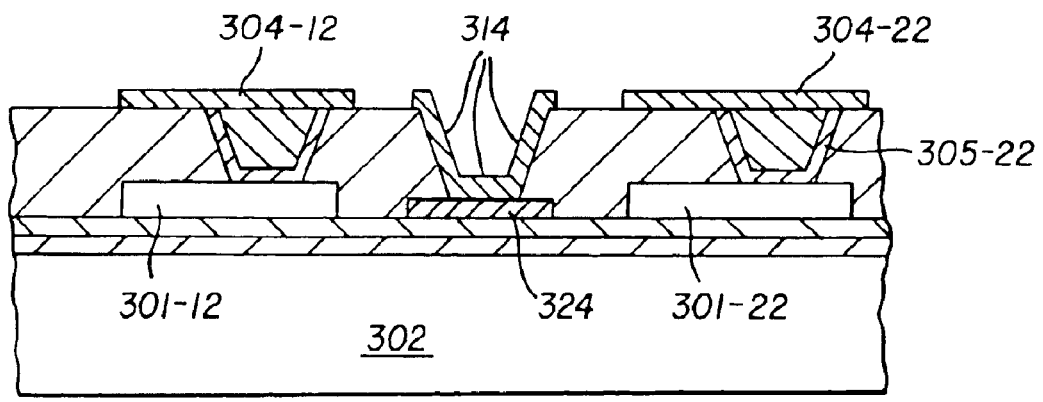
Figure 7D:
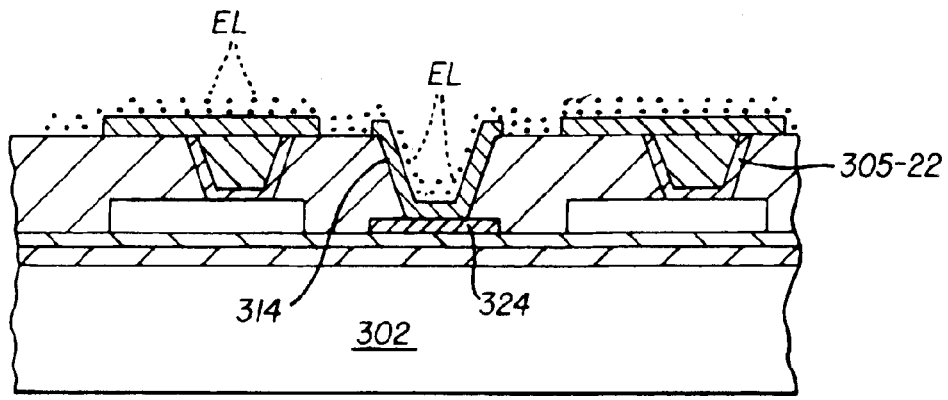
Figure 7E:
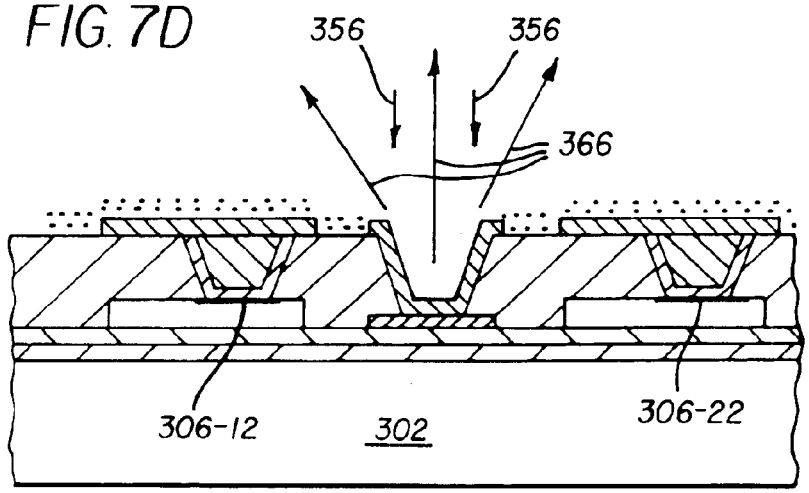
Figure 7F:
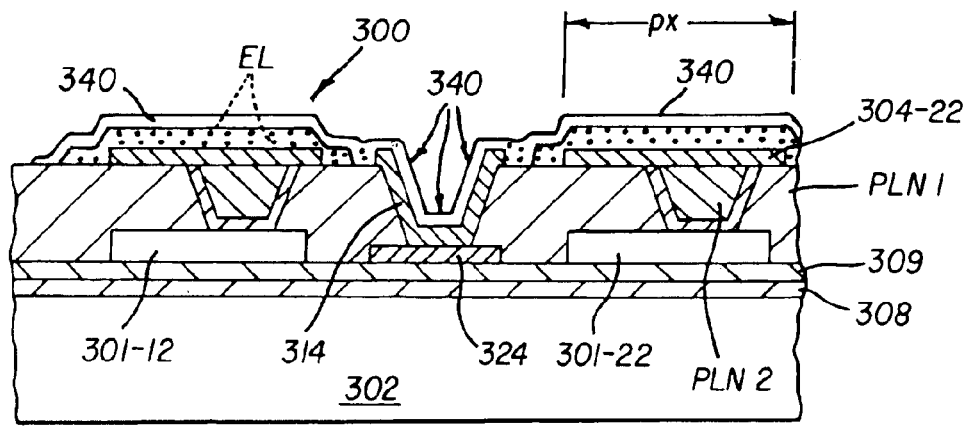

An organic EL medium structure ("EL") is shown in dotted outline in FIG. 6 and in FIGS. 7D–7F.

In FIG. 7A, a first organic planarizing layer PLN1 had been initially provided as a uniform electrically insulative layer over the silicon dioxide layer 309 at a thickness selected to cover and to planarize the elements 301-12, 301-22 (transistors, capacitor, and electrical wiring), and a connector 324 to an upper electrode bus 314 (see FIG. 7C).

The first organic planarizing layer PLN1 can be an optically opaque photoresist layer which is formed, for example, by spin-coating a photoresist solution. The layer PLN1 is patterned by well known photolithography processes to create openings or trenches (not identified) in alignment with, and extending in depth to, the connector contact pads 306. Connectors 305-12 and 305-22 are then formed within these openings or trenches. The connectors can be formed of an elemental metal, a metal alloy, or of a sandwich structure of two or more metals such as, for example, a sandwich structure of molybdenum-aluminum-molybdenum. The connectors 305-12, 305-22 are in electrical contact with corresponding connector contact pads, such as the contact pad 306-12 identified in FIG. 7A.

In FIG. 7B, a second organic planarizing layer PLN2 has been deposited and patterned by a photolithography process to fill and substantially planarize the opening or trench defined by the connectors 305-12, 305-22, while keeping uppermost portions (not identified) of the connectors free of electrically insulative PLN2 deposit. The PLN2 layer can be formed of the same photoresist material as the first planarizing layer PLN1.

A bus trench 321 (or a plurality of bus vias) is then formed in the first organic planarizing layer PLN1 in registration with, and extending in depth to, the connector(s) 324 to upper electrode busses (314).

FIG. 7C shows the process sequence upon deposition and patterning of lower electrodes 304-12, 304-22 over the connectors 305-12 and 305-22, respectively, and an upper electrode bus 314. The lower electrodes are in electrical contact with corresponding connectors 305-12, and 305-22, and the upper electrode bus 314 is in electrical contact with the connector 324. As described above, the active matrix OLED display device 300 usually includes multiple levels of bus lines. The uppermost level of bus lines, namely the upper electrode busses 314, are shown here in detail. These upper electrode busses 314 can be deposited and patterned concurrently with forming the lower electrodes 304.

In FIG. 8D, an organic EL medium structure has been deposited over the upper surfaces of the planarizing layer PLN1, the lower electrodes, and the upper electrode bus 314. If a top-emi7ting active matrix OLED display device is designated to be a multicolor device or a full-color device, neighbor EL medium structures providing different colors of light emission can abut or overlap within the lateral dimensions defined by the upper electrode busses 314.

FIG. 7E shows a step of selectively removing the organic EL medium structure from the upper electrode busses 314. Selective removal occurs by selectively ablating the EL medium structure via radiation 356 which is selectively directed at the upper electrode busses. Ablated material is indicated by arrows 366 which represent the directions of selective removal of the EL medium.

FIG. 7F depicts the completed top-emitting active matrix OLED display device 300 upon forming a common light transmissive upper electrode 340 over the organic EL medium structure and over the upper electrode busses 314. Thus, the common upper electrode 340 is in electrical contact with the upper electrode busses 314, thereby providing improved uniformity of current distribution or of power distribution in the common upper electrode. A light-emitting portion of a pixel or a subpixel px is indicated in FIG. 7F. As indicated in FIG. 6, a width dimension 304W of the lower electrodes can be in a range of 50–250 micrometer, while a width dimension 314W of upper electrode busses (or of bus vias) can be in a range of 3–10 micrometer.

Considerations pertaining to selecting substrates, materials for lower electrodes and upper electrode busses, upper electrode, and methods of selectively removing organic EL medium are the same as described above with reference to FIG. 1 and FIGS. 2A–2E.

In the foregoing description, the process sequence of forming lower electrodes and upper electrode busses, depositing an organic EL medium structure over all features of a partial device, selectively removing the EL medium from the upper electrode busses, and forming a common light transmissive upper electrode in electrical contact with the busses, permits a simplified method of making different classes of top-emitting OLED devices which have improved power distribution.

Figure 8:
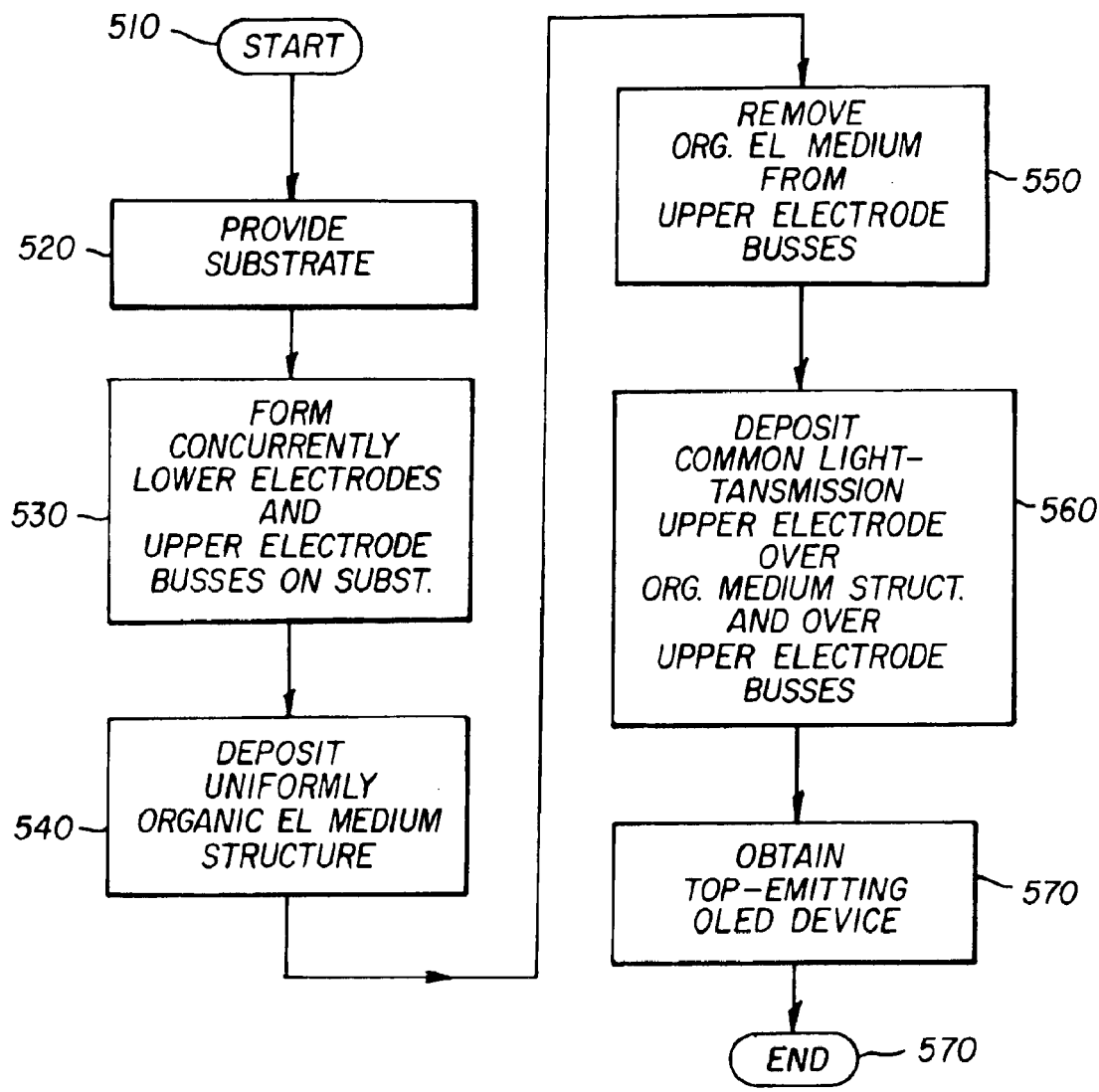
FIG. 8 is a process flow chart showing a sequence of major process steps in obtaining a top-emitting OLED device, in accordance with aspects of the present invention.

FIG. 8 is a process flow chart showing a sequence of major process steps in obtaining a top-emitting OLED device, in accordance with aspects of the present invention.

The process starts at 510. Step 520 includes providing a substrate having an electrically insulative substrate surface. Step 530 includes forming concurrently lower electrodes and upper electrode busses on the insulative substrate surface. Step 540 includes depositing an organic EL medium structure uniformly over the lower electrodes, the upper electrode busses, and other device features. Step 550 includes selectively removing the organic EL medium from the upper electrode busses. Step 560 includes depositing a common light transmissive upper electrode over the organic EL medium structure and over the upper electrode busses for obtaining a top-emitting OLED device, as indicated at 570. The process ends at 580.

Figure 9:
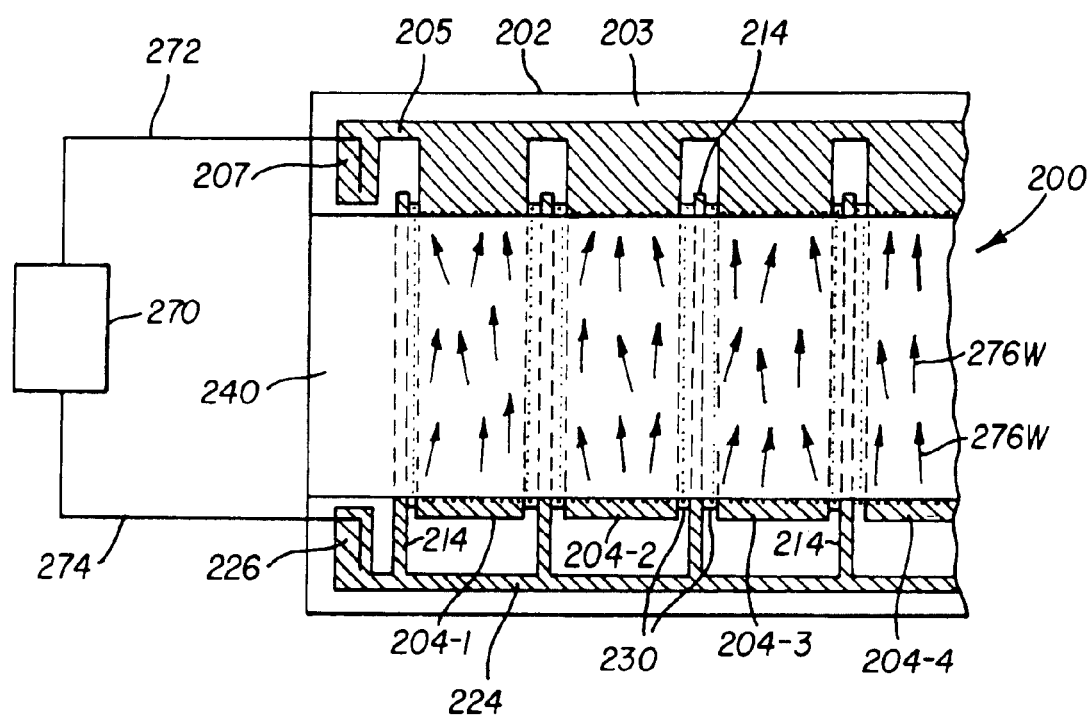
FIG. 9 depicts light emission from an operative top-emitting OLED illuminator device.

FIG. 9 depicts emission of white light 276W from an operative top-emitting OLED illuminator device 200, previously described with reference to FIG. 4.

An electrical power supply 270, also referred to as a drive current supply, is electrically connected to the common lower electrode terminal 207 of the device via a lead 272. Another lead 274 is electrically connected to the common bus connector terminal 226 of the device. The power supply 270 can be a direct current (DC) supply, an alternating current (AC) supply, or a pulsed supply. Enhanced device stability can sometimes be achieved when the OLED device is operated in the AC mode wherein, for some time period of an AC cycle, the electrical potential is reversed and no current flows. An example of an AC-driven OLED device is described in U.S. Pat. No. 5,552,678. The common bus connector terminal is connected to the upper electrode busses 214, and the upper electrode busses 214 are in electrical contact with the light transmissive upper electrode 240 to provide improved current distribution or improved power distribution within the electrode 240.

Uniform emission of white light 276w is indicated by arrows which should be envisioned as being directed upwardly from the device through the light transmissive upper electrode 240.

Organic EL Medium Structure

The organic EL medium structure commonly includes several sublayers which are formed, in sequence, starting with layer deposition over the lower electrodes and upper electrode busses, and over areas disposed between such elements on a surface.

Hole-Injecting Layer (HIL)

While not always necessary, it is often useful to provide a hole-injecting layer as a first sublayer of the sequence of depositions. The hole-injecting material can serve to improve the film formation property of subsequent organic layers and to facilitate injection of holes into a hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA (4,4',4"-tris[(3-methylphenyl)phenylamino]-triphenylamine). Alternative hole-injecting materials reportedly useful in organic EL devices are described in EP 0 891 121 A1 and EP 1 029 909 A1.

Hole-Transporting Layer (HTL)

The hole-transporting layer contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al. U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The hole-transporting layer can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)-phenyl] amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, a light-emitting layer of the organic EL medium structure includes a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes, e.g., poly(p-phenylenevinylene), PPV, can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material. For phosphorescent emitters it is also important that the host triplet energy level of the host be high enough to enable energy transfer from host to dopant.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato) aluminum(III)]
CO-2: Magnesium bisoxine [alias, bis(8-quinolinolato) magnesium(II)]
CO-3: Bis[benzo{f}-8-quinolinolato]zinc (II)
CO-4: Bis(2-methyl-8-quinolinolato)aluminum(III)-☐-oxo-bis(2-methyl-8-quinolinolato) aluminum(III)
CO-5: Indium trisoxine [alias, tris(8-quinolinolato)indium]
CO-6: Aluminum tris(5-methyloxine) [alias, tris(5-methyl-8-quinolinolato) aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato) zirconium(IV)]

Other classes of useful host materials include, but are not limited to: derivatives of anthracene, such as 9,10-di-(2-naphthyl)anthracene and derivatives thereof as described in U.S. Pat. No. 5,935,721, distyrylarylene derivatives as described in U.S. Pat. No. 5,121,029, and benzazole derivatives, for example, 2,2',2"-(1,3,5-phenylene)tris[1-phenyl-1H-benzimidazole]. Carbazole derivatives are particularly useful hosts for phosphorescent emitters.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis (azinyl)methane compounds, and carbostyryl compounds.

Electron-Transporting Layer (ETL)

Preferred thin film-forming materials for use in forming an electron-transporting layer of the organic EL medium structure of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

Other Common Organic Layers

In some instances, the LEL and the ETL can optionally be collapsed into a single layer that serves the function of supporting both light emission and electron transportation. It also known in the art that emitting dopants may be added to the hole-transporting layer, which may serve as a host. Multiple dopants may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, U.S. Patent Application Publication 2002/0025419, EP 1 182 244, U.S. Pat. Nos. 5,683, 823, 5,503,910, 5,405,709, and 5,283,182.

Additional layers such as electron or hole-blocking layers as taught in the art may be employed in devices of this invention. Hole-blocking layers are commonly used to improve efficiency of phosphorescent emitter devices, for example, as in U.S. Patent Application 2002/0015859.

This invention may be used in so-called stacked device architecture, for example, as taught in U.S. Pat. Nos. 5,703, 436 and 6,337,492.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551, 5,851,709 and 6,066,357) and inkjet method (U.S. Pat. No. 6,066,357).

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

The method of making OLED devices in accordance with this invention can employ various well known optical effects in order to enhance device performance if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters over the display. Filters, polarizers, and anti-glare or anti-reflection coatings may be specifically provided over the cover or over an electrode protection layer beneath the cover.

Selective Removal of Organic EL Medium Structure

As described previously, selective removal may be accomplished, for example by laser ablation. One or more linear arrays of lasers, arranged in an integrated circuit, can be translated over the surface of the OLED device, wherein the linear array is aligned with respect to the upper electrode busses from which organic EL material is to be removed. Alternatively, the OLED device can be translated with respect to a stationary linear array of lasers.

Another method of selectively removing organic EL material includes using an optical mask having openings which are aligned with respect to the upper electrode busses, and directing a flood exposure of laser light or light from another light source through the openings onto the device surface, so that organic EL material is ablated at the same time from all upper electrode busses.

A further method of selectively removing organic EL material includes using one or more lasers configured to independently ablate organic EL material from upper electrode busses, and from other areas peripheral to light-emitting areas of an OLED device.

The organic EL medium structure is relatively thin (for example, less than 100 nm) and is readily selectively removed. The structure is relatively transparent but absorbs light or energy at selected wavelengths. The upper electrode busses are typically made of a metal, metal alloy, or of a sandwich configuration of metals, and as such exhibit a level of optical reflectivity. Due to this reflectivity, the ablation process is stopped at the busses, thus preventing ablation beyond the removal of the organic EL medium structure.

The invention has been described in detail with particular reference to certain preferred embodiments thereof, but it will be understood that variations and modifications can be effected within the spirit and scope of the invention. It will be understood that the method of the present invention is applicable for different classes of OLED devices such as polymer OLED devices (either active- or passive-matrix), top-emitting passive matrix OLED devices, and top-emitting active-matrix OLED devices.

PARTS LIST 100 top-emitting passive matrix OLED device
100m modified passive matrix organic electroluminescent device
102 substrate
103 substrate surface
104 lower electrode(s)
104-1 first lower electrode
104-2 second lower electrode
104-3 third lower electrode
104-4 fourth lower electrode
104-5 fifth lower electrode
104W width dimension of lower electrodes
114 upper electrode busses
114W width dimension of upper electrode busses
124 bus connector
126 bus connector pad
130 electrical insulation
132 optically opaque electrical insulation
133 remaining optically opaque electrical insulation
140 common light transmissive upper electrode
144 electrical contact region(s) between upper electrode (140) and upper electrode busses (114)
150 radiation for selective removal of EL medium including laser light beams
152 radiation for selective removal of EL medium and of portions of optically opaque electrical insulation (132)
160 directions of selective removal of EL medium
160W width dimension upon removal of EL medium
162 directions of selective removal of EL medium and of portions of optically opaque electrical insulation (132)
162W width dimension upon removal of EL medium
200 top-emitting OLED illuminator device
202 substrate
203 substrate surface
204 lower electrode(s)
204-1 first lower electrode
204-2 second lower electrode
204-3 third lower electrode
204-4 fourth lower electrode
205 common lower electrode connector
207 common lower electrode terminal
214 upper electrode busses
224 common bus connector
226 common bus connector terminal
240 common light transmissive upper electrode
270 electrical power supply
272 lead
274 lead
276w emitted white light
300 top-emitting active matrix OLED display device
301-12 transistors, capacitor, and electrical wiring (in pixel 1;2)
301-13 transistors, capacitor, and electrical wiring (in pixel 1;3)
301-22 transistors, capacitor, and electrical wiring (in pixel 2;2)
302 substrate
303 substrate surface
304 lower electrode(s)
304W width dimension of lower electrodes
304-12 lower electrode (in pixel 1;2)
304-13 lower electrode (in pixel 1;3)
304-22 lower electrode (in pixel 2;2)
304-23 lower electrode (in pixel 2;3)
304-32 lower electrode (in pixel 3;2)
304-33 lower electrode (in pixel 3;3)
305-12 connector to lower electrode (304-12)
305-22 connector to lower electrode (304-22)
306 connector contact pad(s)
306-12 connector contact pad (in pixel 1;2)
306-13 connector contact pad (in pixel 1;3)
306-22 connector contact pad (in pixel 2;2)
603-23 connector contact pad (in pixel 2;3)
306-33 connector contact pad (in pixel 3;3)
308 silicon nitride layer
309 silicon dioxide layer
314 upper electrode busses
314W width dimension of upper electrode busses
321 bus trench(es) formed in a first organic planarizing layer (PLN1)
324 connector(s) to upper electrode busses (314)
340 common light transmissive upper electrode
356 radiation for selective removal of EL medium
366 directions of selective removal of EL medium
380 X-direction data driving circuit
382 X-direction data input terminal
390 Y-direction driving circuit
510 process start
520 providing substrate
530 forming lower electrodes and upper electrode busses
540 depositing organic EL medium structure
550 removing organic EL medium from upper electrode busses
560 depositing common light transmissive upper electrode
570 obtaining top-emitting OLED device
580 process end
px light-emitting portion of a pixel or subpixel
PLN1 first organic planarizing layer
PLN2 second organic planarizing layer
EL organic electroluminescent ("EL") medium structure
Elnm organic EL medium structure (in a pixel n;m)
Cnm capacitor (in a pixel n;m)
TCnm thin film transistor for current control (in a pixel n;m)
TSnm thin film transistor for switching (in a pixel n;m)
Vdd common power supply lines Xn X-direction data lines where n is an integer
Ym Y-direction scan lines where m is an integer

What is claimed is:

1. A method of making a top-emitting OLED device, comprising:
   a) providing over a substrate laterally spaced and optically opaque lower electrodes and upper electrode busses which are electrically insulated from the lower electrodes wherein the lower electrodes are formed concurrently with forming the upper electrode busses;
   b) depositing an organic EL medium structure over the lower electrodes and the upper electrode busses;
   c) selectively removing the organic EL medium structure over at least portions of the upper electrode busses to reveal at least upper surfaces of the upper electrode busses; and
   d) depositing a light transmissive upper electrode over the organic EL medium structure so that such upper electrode is in electrical contact with at least upper surfaces of the upper electrode busses.

2. The method of claim 1 further including making a top-emitting passive matrix OLED device, a top-emitting active-matrix OLED device, or a polymer OLED device (either active- or passive-matrix).

3. The method of claim 1 further including providing electrically insulating material between each one of the upper electrode busses and adjacent lower electrodes.

4. The method of claim 1 wherein element c) includes removing the organic EL medium structure by selectively ablating such EL medium structure.

5. The method of claim 4 further including:
   i) providing a linear array of laser light beams directed towards the upper electrode busses; and
   ii) providing relative motion between the laser light beams and the substrate having the upper electrode busses formed thereover.

6. The method of claim 4 further including:
   i) providing a source of uniform radiation directed towards the organic EL medium structure; and
   ii) providing a mask between the source and the structure and having openings oriented with respect to the upper electrode busses.

7. The method of claim 4 further including directing one or more laser light beams towards the organic EL medium structure in registration with the upper electrode busses.

8. The method of claim 2 further including providing an electrical connection to each one of the lower electrodes in making a top-emitting passive matrix OLED device or in making a top-emitting active matrix OLED display device.

9. The method of claim 2 further including providing a common electrical connection to all of the lower electrodes in making a top-emitting OLED device.

10. A top-emitting OLED device made in accordance with the method of claim 1.

11. A method of making a top-emitting OLED device, comprising:
    a) providing over a substrate laterally spaced and optically opaque lower electrodes and upper electrode busses which are electrically insulated from the lower electrodes;
    b) depositing an organic EL medium structure over the lower electrodes and the upper electrode busses;
    c) selectively removing the organic EL medium structure by selectively abating such EL medium structure over at least portions of the upper electrode busses to reveal at least upper surfaces of the upper electrode busses by providing relative motion between laser light beams and the substrate having the upper electrode busses formed thereover; and
    d) depositing a light transmissive upper electrode over the organic EL medium structure so that such upper electrode is in electrical contact with at least upper surfaces of the upper electrode busses.

12. A method of making a top-emitting OLED device, comprising:
    a) providing over a substrate laterally spaced and optically opaque lower electrodes and upper electrode busses which are electrically insulated from the lower electrodes;
    b) depositing an organic EL medium structure over the lower electrodes and the upper electrode busses;
    c) selectively removing the organic EL medium structure by selectively abating such EL medium structure over at least portions of the upper electrode busses to reveal at least upper surfaces of the upper electrode busses by directing one or more laser light beams towards the organic EL medium structure in registration with the upper electrode busses; and
    d) depositing a light transmissive upper electrode over the organic EL medium structure so that such upper electrode is in electrical contact with at least upper surfaces of the upper electrode busses.

* * * * *